United States Patent
Huang et al.

(10) Patent No.: US 10,512,165 B2
(45) Date of Patent: Dec. 17, 2019

(54) METHOD FOR MANUFACTURING A CIRCUIT BOARD

(71) Applicant: Unimicron Technology Corp., Taoyuan (TW)

(72) Inventors: Ching-Hao Huang, Taoyuan (TW); Ho-Shing Lee, Taoyuan (TW); Yu-Cheng Lin, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 250 days.

(21) Appl. No.: 15/468,102

(22) Filed: Mar. 23, 2017

(65) Prior Publication Data
US 2018/0279480 A1 Sep. 27, 2018

(51) Int. Cl.
*H05K 3/00* (2006.01)
*H05K 3/06* (2006.01)
*H05K 3/28* (2006.01)

(52) U.S. Cl.
CPC .............. *H05K 3/007* (2013.01); *H05K 3/06* (2013.01); *H05K 3/28* (2013.01); *H05K 2203/163* (2013.01)

(58) Field of Classification Search
CPC .......... B44C 1/22; B44C 1/227; H05K 3/007; H05K 3/06; H05K 3/28; H05K 2203/163
See application file for complete search history.

(56) References Cited

U.S. PATENT DOCUMENTS

| | | | | |
|---|---|---|---|---|
| 5,912,506 A | * | 6/1999 | Colgan | H01L 23/49866 257/750 |
| 6,365,057 B1 | * | 4/2002 | Whitehurst | H05K 3/067 216/13 |
| 6,468,439 B1 | * | 10/2002 | Whitehurst | C23F 1/02 216/100 |
| 8,975,665 B2 | | 3/2015 | Jung et al. | |
| 2015/0325516 A1 | | 11/2015 | Lin et al. | |

* cited by examiner

*Primary Examiner* — Carl J Arbes
(74) *Attorney, Agent, or Firm* — CKC & Partners Co., LLC

(57) ABSTRACT

A circuit board is disposed on a substrate and includes a dielectric layer and a circuit layer. The dielectric layer is disposed on the substrate. The circuit layer is embedded in the dielectric layer and has plural traces. Each of the traces has a first top surface and a first bottom surface which are opposite to each other, and the first bottom surface faces toward the substrate. The first top surface is exposed from the dielectric layer, and an area of a vertical projection of the first top surface on the substrate is smaller than an area of a vertical projection of the first bottom surface on the substrate.

7 Claims, 3 Drawing Sheets

METHOD FOR MANUFACTURING A CIRCUIT BOARD

BACKGROUND

Technical Field

The present disclosure relates to a circuit board and a method for manufacturing the circuit board.

Description of Related Art

Development of consumer electronics has become mainstream of technical products nowadays, such as desktops, laptops, smart phones, digital cameras or portable electronics, and therefore the consumer electronics have greatly attracted attention in the consumer market. Accordingly, in recent years, the development of the portable electronics is one of the focuses in the research. In this regard, demands for circuit boards which is disposed in the portable electronics increase as well. In a manufacturing process of a circuit board, the cost of the circuit board relates to its yield. For example, as the yield of the circuit board can be improved and increased, the cost of the circuit can be accordingly reduced. Therefore, improving the yield of the circuit board become one of the research issues.

SUMMARY

An aspect of the present disclosure is to provide a method for manufacturing a circuit board. In the manufacturing process of the circuit board, an automatic optical inspection (AOI) on a circuit layer is performed directly following a step of forming the circuit layer, thereby determining what the status of the formed circuit layer is. Moreover, the AOI on the circuit layer is performed before a build-up process, thereby preventing the material used in the subsequent processes from being scrapped.

An aspect of the present disclosure is to provide a circuit board, in which the circuit board is disposed on a substrate and includes a dielectric layer and a circuit layer. The dielectric layer is disposed on the substrate. The circuit layer is embedded in the dielectric layer and has plural traces. Each of the traces has a first top surface and a first bottom surface which are opposite to each other, and the first bottom surface faces toward the substrate. The first top surface is exposed from the dielectric layer, and an area of a vertical projection of the first top surface on the substrate is less than an area of a vertical projection of the first bottom surface on the substrate.

In some embodiments, the dielectric layer has a second top surface facing away from the substrate. A shortest vertical distance between the first top surface and the substrate is D1, and a shortest vertical distance between the second top surface and the substrate is D2, in which 2 μm≥D2−D1)>0 μm.

In some embodiments, each of the traces has at least one side surface located between the first top surface and the first bottom surface and connecting the first top surface and the first bottom surface, and the side surface is covered with the dielectric layer.

In some embodiments, a portion of the side surface near the first top surface is a rounded corner and covered with the dielectric layer.

An aspect of the present disclosure is to provide a method for manufacturing the circuit board, and the method includes the following steps. A first metal layer is formed on a substrate, and a second metal layer is formed on the first metal layer. The first metal layer is formed from a first material, and the second metal layer is formed from a second material that is different from the first material. A pattern layer is formed on the second metal layer, and a third metal layer is formed on the second metal layer through the pattern layer. The third metal layer is formed from a third material, and the second material is the same as the third material. The pattern layer and a portion of the second metal layer are removed, in which a combination of the remained second metal layer and the third metal layer becomes a circuit layer.

In some embodiments, the method further includes performing an AOI on the circuit layer, so as to determine what the status of the formed circuit layer is.

In some embodiments, the build-up process includes forming a dielectric layer on the circuit layer, in which the circuit layer is embedded between the first metal layer and the dielectric layer.

In some embodiments, the method further includes removing the substrate and removing the first metal layer from the circuit layer and the dielectric layer.

In some embodiments, the first metal layer is formed from a first metal material and a circuit layer is formed from a second metal material, and the optical reflectivity of the first metal material is different from that of the second metal material.

In some embodiments, the step of removing the portion of the second metal layer includes removing the portion of the second metal layer by using an etchant. The etchant has a first etching rate with respect to the first metal layer and a second etching rate with respect to the second metal layer, and the first etching rate is lower than the second etching rate.

DETAILED DESCRIPTION

Figure 1A:
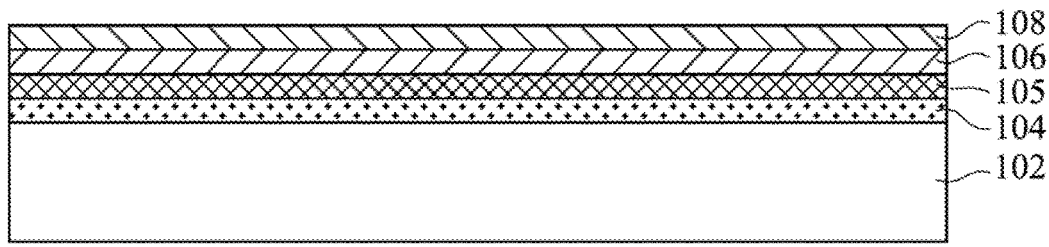
FIG. 1A to FIG. 1I are schematic cross-sectional views of intermediate stages according to a method for manufacturing a circuit board in some embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

It will be understood that, although the terms first, second, third etc. may be used herein to describe various elements, components, regions, layers and/or sections, these elements, components, regions, layers and/or sections should not be limited by these terms.

According to the relation between a yield rate and cost of manufacturing a circuit board, once the yield rate of the circuit board increases, the manufacturing cost of the circuit board decreases accordingly. In a manufacturing process of a circuit board of the present disclosure, a step of performing an automatic optical inspection (AOI) on a circuit layer is performed directly following a step of forming the circuit layer, thereby determining whether the subsequent process should be performed on the formed circuit layer, thus avoiding wasting the cost of the subsequent process.

FIG. 1A to FIG. 1I are schematic cross-sectional views of intermediate stages according to a method for manufacturing a circuit board in some embodiments of the present disclosure. Reference is made to FIG. 1A. In this stage, a peelable layer 104 and an auxiliary layer 105 are first formed on a first substrate 102. The first substrate 102 may serve as a carrier substrate. The peelable layer 104 may be a colloid layer, and the auxiliary layer 105 may be formed from copper, such as a copper foil. Then, a first metal layer 106 is formed on the auxiliary layer 105, and a second metal layer 108 is formed on the first metal layer 106. The first metal layer 106 and the second metal layer 108 may be formed by a sputtering process or an electroplating process. The first metal layer 106 is formed from a first material and the second metal layer 108 is formed from a second material. The first material is different from the second material, such that the material property of the first metal layer 106 is different from the material property of the second metal layer 108. For example, the first metal layer 106 may be formed from titanium and the second metal layer 108 may be formed from copper, such that the optical reflectivity of the first metal layer 106 is different from the optical reflectivity of the second metal layer 108. Alternatively, in other embodiments, the first metal layer 106 is formed from metal with dark appearance, such as titanium, nickel, chromium, manganese, iron, and thus the metallic luster of the first metal layer 106 is different from that of the copper.

Figure 1B:
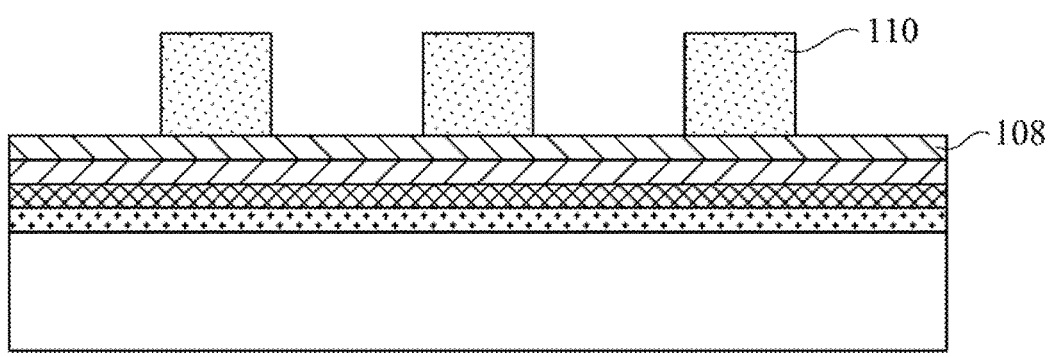

Reference is made to FIG. 1B. In this stage, a pattern layer 110 is formed on the second metal layer 108, and a portion of the second metal layer 108 is exposed from the pattern layer 110. The pattern layer 110 may be formed from a photoresist material. That is, a photoresist layer is first formed on the second metal layer 108, and then a lithographing process is performed on the photoresist layer, so as to form the pattern layer 110 after a developing process.

Figure 1C:
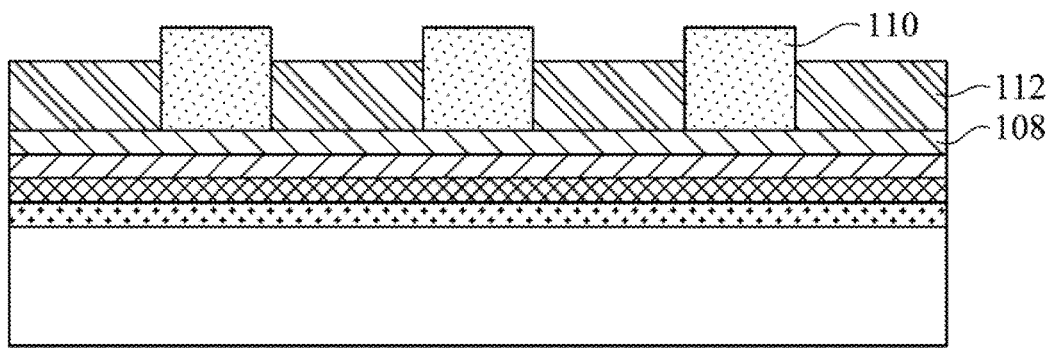
Figure 1D:
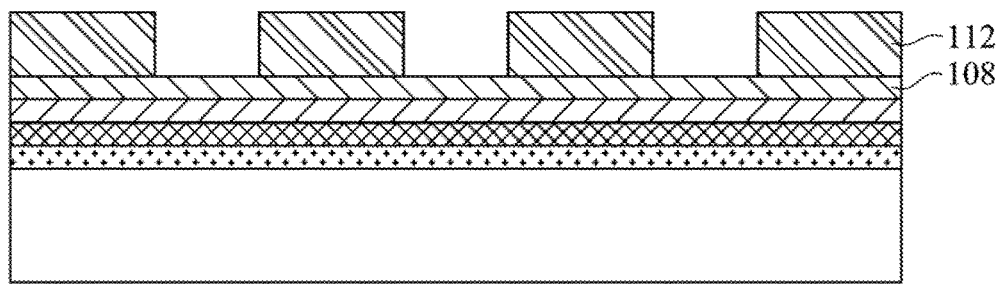

Reference is made to FIG. 1C and FIG. 1D. In this stage, a third metal layer 112 is formed on the second metal layer 108 through the pattern layer 110. That is, the pattern layer 110 may serve as a mask, and the third metal layer 112 may be formed on the second metal layer 108 by an electroplating process. The third metal layer 112 is formed from a third material, and the second material is the same as the third material. For example, the second metal layer 108 and the third metal layer 112 may be formed from copper. Furthermore, in the manufacturing processes of the second metal layer 108 and the third metal layer 112, process parameters for forming the second metal layer 108 may be different from those for forming the third metal layer 112, such that the densification of the third metal layer 112 may be greater than that of the second metal layer 108. Similarly, the thickness of the third metal layer 112 may be greater than the thickness of the second metal layer 108. After the third metal layer 112 is formed, the pattern layer 110 is removed. Then, after the pattern layer 110 is removed, a portion of the second metal layer 108 is exposed from the third metal layer 112.

Figure 1E:
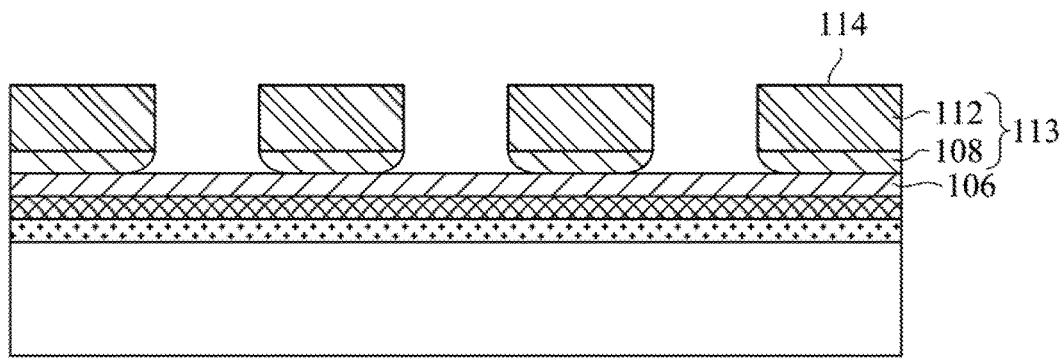

Reference is made to FIG. 1E. In this stage, the portion of the second metal layer 108 exposed from the third metal layer 112 is removed by an etching process. Since the densification and thickness of the third metal layer 112 are respectively greater than the densification and thickness of the second metal layer 108, an etchant may be used to remove the portion of the second metal layer 108 exposed from the third metal layer 112. Furthermore, the etchant has a first etching rate with respect to the first metal layer 106 and a second etching rate with respect to the second metal layer 108, and the first etching rate is smaller than the second etching rate, such that the first metal layer 106 may serve as an etching stop layer in the etching process. Moreover, the remaining second metal layer 108 may have at least one rounded corner at an interface between the second metal layer 108 and the first metal layer 106. After the etching process, a combination of the remaining second metal layer 108 and the third metal layer 112 may become a circuit layer 113. The circuit layer 113 has plural traces 114, and a portion of the first metal layer 106 may be exposed from the circuit layer 113.

Figure 1F:
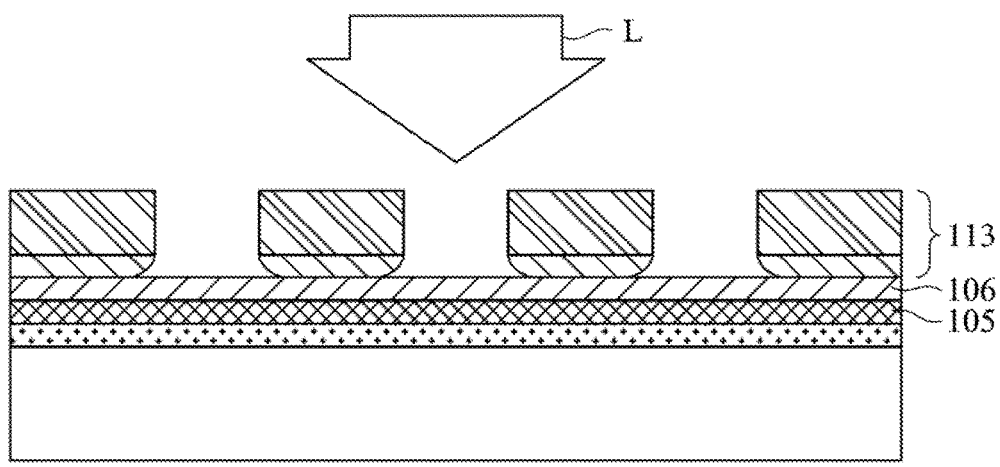

Reference is made to FIG. 1F. In this stage, a light beam L is used for illuminating the circuit layer 113 and the first metal layer 106, so as to perform an AOI on the circuit layer 113. In the AOI, an image of the circuit layer 113 and the first metal layer 106 can be captured by a charge-coupled device (CCD) after the illumination of the light L. Then, by the contrast of the circuit layer 113 and the first metal layer 106, it can be determined whether the circuit layer 113 has an unexpected situation occurring, such as a short circuit or an open circuit. In other words, due to the difference between the optical reflectivity of the first metal layer 106 and that of the circuit layer 113, it can be determined whether the circuit layer 113 has an unexpected situation occurring. After the AOI, when the yield rate of the circuit layer 113 is above a proper value, it is determined that the subsequent process may be allowed to be performed on the circuit layer 113, such as a build-up process.

Figure 1G:
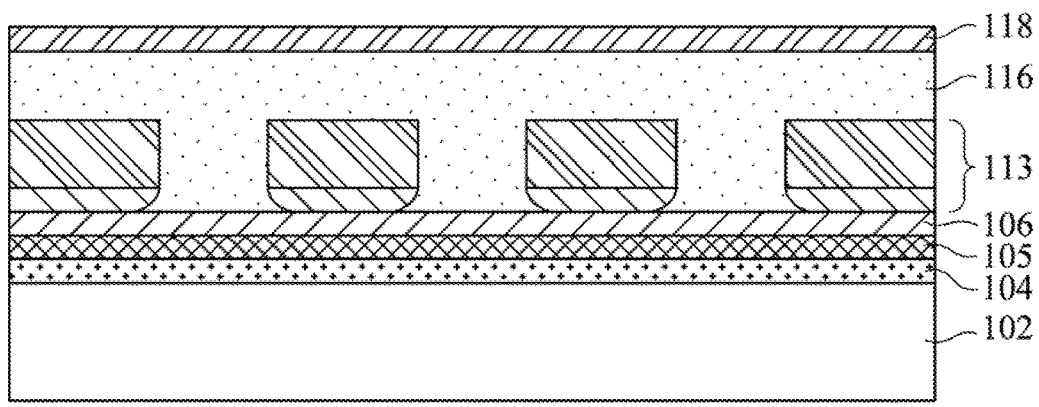
Figure 1H:
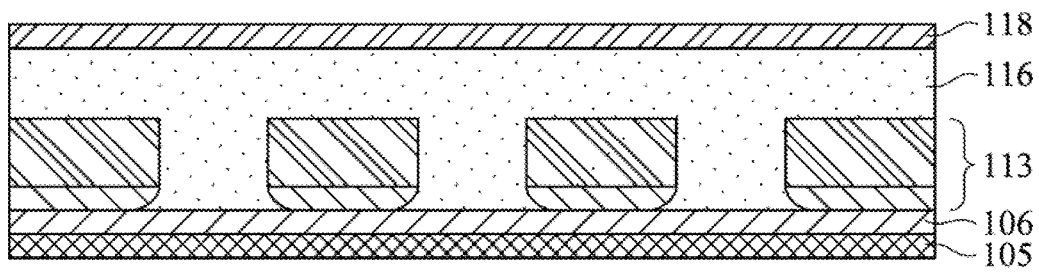
Figure 1I:
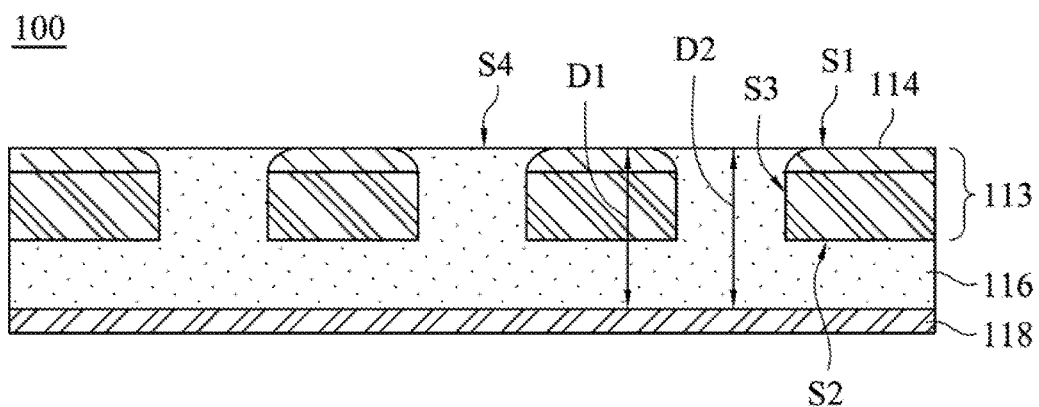

Reference is made to FIG. 1G, FIG. 1H, and FIG. 1I. In this stage, a build-up process is performed on the circuit layer 113. The build-up process includes forming a dielectric layer 116 on the circuit layer 113 and forming a second substrate 118 on the dielectric layer 116, in which the circuit layer 113 is embedded between the first metal layer 106 and the dielectric layer 116. The second substrate 118 may serve as a transferring substrate. Then, with the peelable layer 104, the first substrate 102 can be separated from the auxiliary metal layer 105, and thus the first substrate 102 is removed and the auxiliary metal layer 105 is exposed therefrom. After the first substrate 102 is removed, the auxiliary metal layer 105 and the first metal layer 106 are removed from a combination of the circuit layer 113 and the dielectric layer 116, thereby exposing the circuit layer 113 therefrom. For example, the auxiliary metal layer 105 and the first metal layer 106 can be removed by an etching process. Then, a combination of the circuit layer 113, the dielectric layer 116, and the second substrate 118 is reversed to become a circuit board 100 illustrated in FIG. 1I.

The circuit board 100 manufactured by the aforementioned steps can have high structural strength, and increase the yield rate of the subsequent surface-mount-technology (SMT) process, as described below. As shown in FIG. 1I, the dielectric layer 116 and the circuit layer 113 of the circuit board 100 are located on the second substrate 118, and the circuit layer 113 is embedded in the dielectric layer 116. The trace 114 of the circuit layer 113 has a first top surface S1, a first bottom surface S2, and a side surface S3, in which the first top surface S1 and first bottom surface S2 are opposite to each other. The first bottom surface 82 of the trace 114 faces toward the second substrate 118, and the first top surface S1 of the trace 114 is exposed from the dielectric layer 116. An area of a vertical projection of the first top surface S1 of the trace 114 on the second substrate 118 is smaller than an area of a vertical projection of the first bottom surface S2 of the trace 114 on the second substrate 118. The side surface S3 of the trace 114 is disposed between the first top surface S1 and the first bottom surface S2, and is connected with the first top surface S1 and the first bottom surface 82. The side surface S3 has at least one rounded corner near the first bottom surface S1. The side surface S3 of the trace 114 is covered with the dielectric layer 116, in which the rounded-corner portion of the side surface S3 of the trace 114 is covered with the dielectric layer 116 as well.

Under the configuration that the area of the vertical projection of the first top surface S1 of the trace 114 on the second substrate 118 is smaller than the area of the vertical projection of the first bottom surface S2 of the trace 114 on the second substrate 118, since the rounded-corner portion of the side surface S3 of the trace 114 is covered with the dielectric layer 116, the trace 114 of the circuit layer 113 can be prevented from separating form the dielectric layer 116, thereby improving the structural strength of the circuit board 100.

On the other hand, the dielectric layer 116 has a second top surface S4 facing away from the second substrate 118. In the manufacturing process of the circuit board 100, since the step of removing the portion of the second metal layer 108 (see FIG. 1D and FIG. 1E) exposed from the third metal layer 112 (see FIGS. 1D and 1E) by the etching process is performed before the build-up process, a gap between the first top surface S1 of the trace 114 and the second top surface S4 of the dielectric layer 116 is reduced. In the present embodiment, a shortest vertical distance between the first top surface S1 of the trace 114 and the second substrate 118 is denoted as a distance D1, and a shortest vertical distance between the second top surface S4 of the dielectric layer 116 and the second substrate 118 is denoted as a distance D2, in which 2 µm≥(distance D2−distance D1)>0 µm. In other embodiments, the first top surface S1 of the trace 114 and the second top surface S4 of the dielectric layer 116 are substantially coplanar. Since the gap between the first top surface S1 of the trace 114 and the second top surface S4 of the dielectric layer 116 is reduced, a solder ball (not illustrated) can be easily disposed on the first top surface S1 of the trace 114, thereby improving the yield rate of the SMT process.

As described above, in the method for manufacturing the circuit board of the present disclosure, the step of performing the AOI on the circuit layer is performed directly following the step of forming the circuit layer, thereby determining what the status of the formed circuit layer is. Moreover, the AOI on the circuit layer is performed before the build-up process, thereby preventing the material used in the sequential processes from being scrapped. Furthermore, in the manufacturing process of the circuit board, since the step of removing the portion of the second metal layer is performed earlier than the build-up process, the traces of the circuit layer can be solidly embedded in the dielectric layer. Therefore, the traces of the circuit layer are prevented from separating from the dielectric layer, and the structural strength of the circuit board is improved.

It will be apparent to those skilled in the art that various modifications and variations can be made to the structure of the present disclosure without departing from the scope or spirit of the invention. In view of the foregoing, it is intended that the present disclosure cover modifications and variations of the present disclosure provided they fall within the scope of the following claims.

What is claimed is:

1. A method for manufacturing a circuit board, the method comprising:
    forming a first metal layer on a substrate and forming a second metal layer on the first metal layer, wherein the first metal layer is formed from a first material, and the second metal layer is formed from a second material that is different from the first material;
    forming a pattern layer on the second metal layer and forming a third metal layer on the second metal layer through the pattern layer, wherein the third metal layer is formed from a third material that is the same as the second material; and
    removing the pattern layer and a portion of the second metal layer, wherein a combination of the remained second metal layer and the third metal layer becomes a circuit layer, wherein the first metal layer is formed from a first metal material, and the circuit layer is formed from a second metal material of which optical reflectivity of the first metal material is different from optical reflectivity of the second metal material.

2. The method of claim 1, further comprising:
    performing an automatic optical inspection (AOI) on the circuit layer, so as to determine what the status of the formed circuit layer is and determine whether a build-up process is allowed to be performed on the circuit layer.

3. The method of claim 2, wherein the build-up process comprises:
    forming a dielectric layer on the circuit layer, wherein the circuit layer is embedded between the first metal layer and the dielectric layer.

4. The method of claim 1, wherein removing the portion of the second metal layer comprises:
    removing the portion of the second metal layer through an etchant, wherein the etchant has a first etching rate with respect to the first metal layer and a second etching rate with respect to the second metal layer, and the first etching rate is lower than the second etching rate.

5. A method for manufacturing a circuit board, the method comprising:
    forming a first metal layer on a substrate and forming a second metal layer on the first metal layer, wherein the first metal layer is forme from a first material, and the second metal layer is formed from a second material that is different from the first material;
    forming a pattern layer on the second metal layer and forming a third metal layer on the second metal layer through the pattern layer, wherein the third metal layer is formed from a third material that is the same as the second material;
    removing the pattern layer and a portion of the second metal layer, wherein a combination of the remained second metal layer and the third metal layer becomes a circuit layer;
    performing an automatic optical inspection (AOI) on the circuit layer, so as to determine what the status of the formed circuit layer is and determine whether a build-up process is allowed to be performed on the circuit layer, wherein the build-up process comprises forming a dielectric layer on the circuit layer, and the circuit layer is embedded between the first metal layer and the dielectric layer; and
    removing the substrate and removing the first metal layer from the circuit layer and the dielectric layer.

6. A circuit board produced by the method of claim 5.

7. The circuit board of claim 6, wherein the remained second metal layer has at least one rounded corner.

* * * * *